United States Patent
Hirasaki et al.

(10) Patent No.: US 7,876,633 B2
(45) Date of Patent: Jan. 25, 2011

(54) INTEGRATED CIRCUIT INCLUDING BUILT-IN SELF TEST CIRCUIT TO TEST MEMORY AND MEMORY TEST METHOD

(75) Inventors: Yasuyuki Hirasaki, Kanagawa (JP);
Yoshitaka Aoki, Kanagawa (JP);
Katsumi Shinbo, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 122 days.

(21) Appl. No.: 12/382,416

(22) Filed: Mar. 16, 2009

(65) Prior Publication Data
US 2009/0238018 A1    Sep. 24, 2009

(30) Foreign Application Priority Data
Mar. 18, 2008    (JP) .............................. 2008-069151

(51) Int. Cl.
*G11C 29/12* (2006.01)
(52) U.S. Cl. ........................................ 365/201; 714/733
(58) Field of Classification Search ................. 365/239
See application file for complete search history.

(56) References Cited
U.S. PATENT DOCUMENTS
6,728,910 B1 * 4/2004 Huang ........................ 714/711

| | | | |
|---|---|---|---|
| 7,222,272 B2 | 5/2007 | Takazawa et al. | |
| 7,426,663 B2 | 9/2008 | Takazawa et al. | |
| 7,729,185 B2 * | 6/2010 | Shirur et al. ................ | 365/201 |
| 2003/0222283 A1 | 12/2003 | Takazawa et al. | |
| 2007/0198880 A1 | 8/2007 | Takazawa et al. | |
| 2009/0063917 A1 * | 3/2009 | Tokunaga et al. ........... | 714/719 |

FOREIGN PATENT DOCUMENTS
JP    2002-32999    1/2002
JP    2003-346500    12/2003

* cited by examiner

*Primary Examiner*—Tan T. Nguyen
(74) *Attorney, Agent, or Firm*—McGinn IP Law Group, PLLC

(57) ABSTRACT

An integrated circuit includes multiple memory circuits including memory cell arrays different in size, a BIST circuit which has a cell sequential transition test processor and which outputs a test cell address, a transition direction specification signal and an active signal. The integrated circuit has adjustment circuits which are provided respectively for the memory circuits and which replace the test cell address with the test cell address in a memory cell array area, or which convert the active signal into a signal indicating non-execution when the test cell address outputted from the BIST circuit corresponds to a cell in a virtual cell array being in an area outside the memory cell array.

10 Claims, 10 Drawing Sheets

Fig. 2A

|   | 1 | 2 | 3 | 4 | 5 | 6 | 7 | 8 |
|---|---|---|---|---|---|---|---|---|
| 8 | 56 | 57 | 58 | 59 | 60 | 61 | 62 | 63 |
| 7 | 48 | 49 | 50 | 51 | 52 | 53 | 54 | 55 |
| 6 | 40 | 41 | 42 | 43 | 44 | 45 | 46 | 47 |
| 5 | 32 | 33 | 34 | 35 | 36 | 37 | 38 | 39 |
| 4 | 24 | 25 | 26 | 27 | 28 | 29 | 30 | 31 |
| 3 | 16 | 17 | 18 | 19 | 20 | 21 | 22 | 23 |
| 2 | 8 | 9 | 10 | 11 | 12 | 13 | 14 | 15 |
| 1 | 0 | 1 | 2 | 3 | 4 | 5 | 6 | 7 |

Fig. 2B

| 56 | 57 | 58 | 59 | 60 | 61 | 62 | 63 |
|---|---|---|---|---|---|---|---|
| 48 | 49 | 50 | 51 | 52 | 53 | 54 | 55 |
| 40 | 41 | 42 | 43 | 44 | 45 | 46 | 47 |
| 32 | 33 | 34 | 35 | 36 | 37 | 38 | 39 |
| 24 | 25 | 26 | 27 | 28 | 29 | 30 | 31 |
| 16 | 17 | 18 | 19 | 20 | 21 | 22 | 23 |
| 8 | 9 | 10 | 11 | 12 | 13 | 14 | 15 |
| 0 | 1 | 2 | 3 | 4 | 5 | 6 | 7 |

| 1 | 2 | 3 | 4 | 5 | 6 | 7 | 8 |

Fig. 6

| A[5:0] | 0 | 1 | 2 | 3 | 4 | 5 | (6) | (7) | 8 | 9 | 10 | 11 | 12 | 13 | (14) | (15) | ···OMITTED··· | 56 | 57 | 58 | 59 | 60 | 61 | (62) | (63) |
|---|---|---|---|---|---|---|---|---|---|---|---|---|---|---|---|---|---|---|---|---|---|---|---|---|---|
| CS | 1 | 1 | 1 | 1 | 1 | 1 | 1 | 1 | 1 | 1 | 1 | 1 | 1 | 1 | 1 | 1 | ···OMITTED··· | 1 | 1 | 1 | 1 | 1 | 1 | 1 | 1 |
| A[5:3] | 0 | 0 | 0 | 0 | 0 | 0 | 0 | 0 | 1 | 1 | 1 | 1 | 1 | 1 | 1 | 1 | ···OMITTED··· | 7 | 7 | 7 | 7 | 7 | 7 | 7 | 7 |
| A[2:0] | 0 | 1 | 2 | 3 | 4 | 5 | [0] | [1] | 0 | 1 | 2 | 3 | 4 | 5 | [0] | [1] | ···OMITTED··· | 0 | 1 | 2 | 3 | 4 | 5 | [0] | [1] |
| CS | 1 | 1 | 1 | 1 | 1 | 1 | [0] | 1 | 1 | 1 | 1 | 1 | 1 | 1 | [0] | 1 | ···OMITTED··· | 1 | 1 | 1 | 1 | 1 | 1 | [0] | 1 |

| | | | | | | | | | | | | | | | | | | | |
|---|---|---|---|---|---|---|---|---|---|---|---|---|---|---|---|---|---|---|---|
| A[5:0] | 0 | 1 | 2 | 3 | 4 | 5 | 6 | 7 | ···OMITTED··· | 24 | 25 | 26 | 27 | 28 | 29 | 30 | 31 | ···OMITTED··· | 56 | 57 | 58 | 59 | 60 | 61 | 62 | 63 |
| CS | 1 | 1 | 1 | 1 | 1 | 1 | 1 | 1 | ···OMITTED··· | 1 | 1 | 1 | 1 | 1 | 1 | 1 | 1 | ···OMITTED··· | 1 | 1 | 1 | 1 | 1 | 1 | 1 | 1 |
| A[4:3] | 0 | 0 | 0 | 0 | 0 | 0 | 0 | 0 | ···OMITTED··· | 3 | 3 | 3 | 3 | 3 | 3 | 3 | 3 | ···OMITTED··· | 7 | 7 | 7 | 7 | 7 | 7 | 7 | 7 |
| A[1:0] | 0 | 1 | 2 | 3 | 0 | 1 | 2 | 3 | ···OMITTED··· | 0 | 1 | 2 | 3 | 0 | 1 | 2 | 3 | ···OMITTED··· | 0 | 1 | 2 | 3 | 4 | 5 | 6 | 7 |
| CS | 1 | 1 | 1 | 1 | 0 | 0 | 0 | 1 | ···OMITTED··· | 1 | 1 | 1 | 1 | 0 | 0 | 0 | 0 | ···OMITTED··· | 0 | 0 | 0 | 0 | 0 | 0 | 0 | 0 |

Fig. 10

| | | | | | | | | | | | | | | | | | | | | | |
|---|---|---|---|---|---|---|---|---|---|---|---|---|---|---|---|---|---|---|---|---|---|
| A[5:0] | 0 | 8 | 16 | 24 | (32) | (40) | (48) | (56) | ···OMITTED··· | 3 | 11 | 19 | 27 | (35) | (43) | (51) | (59) | ···OMITTED··· | (7) | (15)(23)(31)(39)(47)(55)(63) |
| CS | 1 | 1 | 1 | 1 | 1 | 1 | 1 | 1 | ···OMITTED··· | 1 | 1 | 1 | 1 | 1 | 1 | 1 | 1 | ···OMITTED··· | 1 | 1  1  1  1  1  1  1 |
| A[4:3] | 0 | 1 | 2 | 3 | 0 | 1 | 2 | 3 | ···OMITTED··· | 0 | 1 | 2 | 3 | 0 | 1 | 2 | 3 | ···OMITTED··· | 0 | 1  2  3  0  1  2  3 |
| A[1:0] | 0 | 0 | 0 | 0 | 0 | 0 | 0 | 0 | ···OMITTED··· | 3 | 3 | 3 | 3 | 3 | 3 | 3 | 3 | ···OMITTED··· | 3 | 3  3  3  3  3  3  3 |
| CS | 1 | 1 | 1 | 1 | [0] | [0] | [0] | [1] | ···OMITTED··· | 1 | 1 | 1 | 1 | [0] | [0] | [0] | [0] | ···OMITTED··· | 1 | 1  1  1  [0][0][0][0] |

INTEGRATED CIRCUIT INCLUDING BUILT-IN SELF TEST CIRCUIT TO TEST MEMORY AND MEMORY TEST METHOD

BACKGROUND OF THE INVENTION

1. Field of the Invention

The present invention relates to an integrated circuit, and particularly relates to a technique for simultaneously testing a plurality of memories with a BIST (Built-in Self Test) circuit.

2. Description of Related Art

There is an integrated circuit in which multiple memory circuits whose memory cell arrays are different in size and a BIST circuit for running self tests on the multiple memory circuits are mounted on a substrate. In such an integrated circuit, required is a technique for simultaneously testing multiple memory circuits while maintaining a high test quality.

An integrated circuit related to the conventional technique includes multiple memory circuits and an internal address bus connected thereto. Specifically, assume here that a memory circuit in which the total sum of the number of upper address bits and the number of lower address bits is the largest of the memory circuits is set as a reference circuit. Then, the multiple memory circuits are formed such that each of the other memory circuits has upper address bits and lower address bits not more than the reference memory circuit does. In addition, the internal bus is connected to those other memory circuits in a manner that a predetermined number of bits from the most significant bit of the reference memory circuit are sequentially inputted as the upper address, and that a predetermined number of bits from the least significant bit of the reference memory circuit are sequentially inputted as the lower address (refer to Patent Document 1: Japanese Patent Application Laid Open Publication No. 2002-32999). Accordingly, multiple memory circuits can be tested simultaneously without including a dedicated test (BIST) circuit in each memory circuit.

In addition, an integrated circuit according to another conventional technique includes a common test bus connected to multiple memories and multiple bridge circuits each of which converts test data information inputted from the common test bus into one having an access data width unique to the corresponding memory and which supplies the resultant information to the memory. Thereby, the integrated circuit supplies the test data information from the common test bus to the multiple memories in parallel (refer to Patent Document 2: Japanese Patent Application Laid Open Publication No. 2003-346500). This is considered to enable parallel test execution on multiple memories.

SUMMARY

Here, methods for testing memory circuits include a method of sequentially causing the address of a test target memory cell to transition in a row or column direction on a memory cell array. This method is effective in detecting a failure and the like caused by data interference between adjacent memory cells. In the present specification, such a test is referred to as cell sequential transition test.

The integrated circuit disclosed in the above Patent Document 1 is configured to simultaneously test the multiple memory circuits whose memory cell arrays are different in size by uniformly outputting the addresses of test target memory cells to decoders for the respective memory circuits through the internal address bus so as to execute tests on memory cells having the same address in all the memory circuits. For this reason, the integrated circuit has a problem of being incapable of execute the cell sequential transition test if any of the memory circuits has a memory cell array in which both or either of an upper address (a row address) size and a lower address (a column address) size are/is not the factorial of 2. Moreover, the above Patent Document 2 discloses no technique for solving this problem, either.

The present invention includes an integrated circuit comprising: a plurality of memory circuits whose memory cell arrays are different in size; a BIST circuit which includes a cell sequential transition test processor executing a cell transition test in which a test target memory cell is caused to sequentially transition in a row or column direction, the BIST circuit outputting a test cell address specifying a location of the memory cell targeted for the cell sequential transition test, a transition direction specification signal specifying a transition direction in the memory cells in the cell sequential transition test, and an active signal determining the execution/non-execution of the cell sequential transition test for the test cell address; and adjustment circuits provided for the respective memory circuits, each adjustment circuit performing either replacement of the test cell address outputted from the BIST circuit with an address in an area inside the corresponding memory cell array or conversion of the active signal into one indicating non-execution, when the test cell address corresponds to a cell in a virtual cell array being an area outside the memory cell array.

The integrated circuit causes the adjustment means to automatically adjust the test cell address and the active signal, which are uniformly outputted by the BIST circuit, so as to fit the test cell address and the active signal to each of the memory circuits. In other words, when the test cell address outputted from the BIST circuit corresponds to a cell in the virtual cell array, the address is replaced with an address in the memory cell array existing in each of the memory circuit, or the active signal is converted into one indicating non-execution state. Accordingly, the single BIST circuit allows the cell sequential transition test to be executed on the memory circuits which are different in size. Moreover, even if a memory circuit where the number of memory cells is not the factorial of 2 is mixed, the cell sequential transition test can be simultaneously executed on all the memory circuits.

Additionally, the present invention includes a memory test method for an integrated circuit configured by including a plurality of memory circuits whose memory cell array sizes are different, a BIST circuit which outputs a signal for testing each of the memory circuits, and adjustment circuits each of which adjusts the signal outputted from the BIST circuit so as to fit the signal to a structure of the corresponding memory circuit, the method comprising the steps of: causing the BIST circuit to output a test cell address that specifies a location of a test target memory cell in a cell sequential transition test in which the test target memory cell is caused to sequentially transition in a row or column direction; causing the BIST circuit to output an transition direction specification signal that specifies a transition direction in the memory cells in the cell sequential transition test; causing the BIST circuit to output an active signal that determines the execution/non-execution of the cell sequential transition test for the test cell address; and causing each of the adjustment circuits to perform either replacement of the test cell address with an address in an area inside the corresponding memory cell array or conversion of the active signal into one indicating non-execution, when the test cell address corresponds to a cell in a virtual cell array being an area outside the memory cell array.

Similarly to an integrated circuit according to the present invention, the method causes the adjustment means to automatically adjust the test cell address and the active signal, which are uniformly outputted by the BIST circuit, so as to fit the test cell address and the active signal to each of the memory circuits. In other words, when the test cell address outputted from the BIST circuit corresponds to a cell in the virtual cell array, the address is replaced with an address in the memory cell array existing in each of the memory circuit, or the active signal is converted into one indicating non-execution state. Accordingly, the single BIST circuit allows the cell sequential transition test to be executed on the memory circuits which are different in size. Moreover, even if a memory circuit where the number of memory cells is not the factorial of 2 is mixed, the cell sequential transition test can be simultaneously executed on all the memory circuits.

As described above, according to the present invention, one BIST circuit allows the cell sequential transition test to be executed on multiple memory circuits which are different in size. Furthermore, even if a memory circuit where the number of memory cells is not the factorial of 2 is mixed, the cell sequential transition test can be simultaneously executed on all the memory circuits.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 2A is a view for explaining a cell sequential transition test where the transition direction in memory cells is set to a row direction, and FIG. 2B is a view for explaining a cell sequential transition test where the transition direction in memory cells is set to a column direction;

FIG. 6 is an example of the adjustment results of test cell addresses and active signals in a second memory circuit in the first exemplary embodiment;

FIG. 7 is an example of the adjustment results of the test cell addresses and the active signals in a third memory circuit in the first exemplary embodiment;

FIG. 10 is an example of the adjustment results of the test cell addresses and the active signals in a third memory circuit in the second exemplary embodiment.

DETAILED DESCRIPTION OF THE EXEMPLARY EMBODIMENTS

Figure 1:
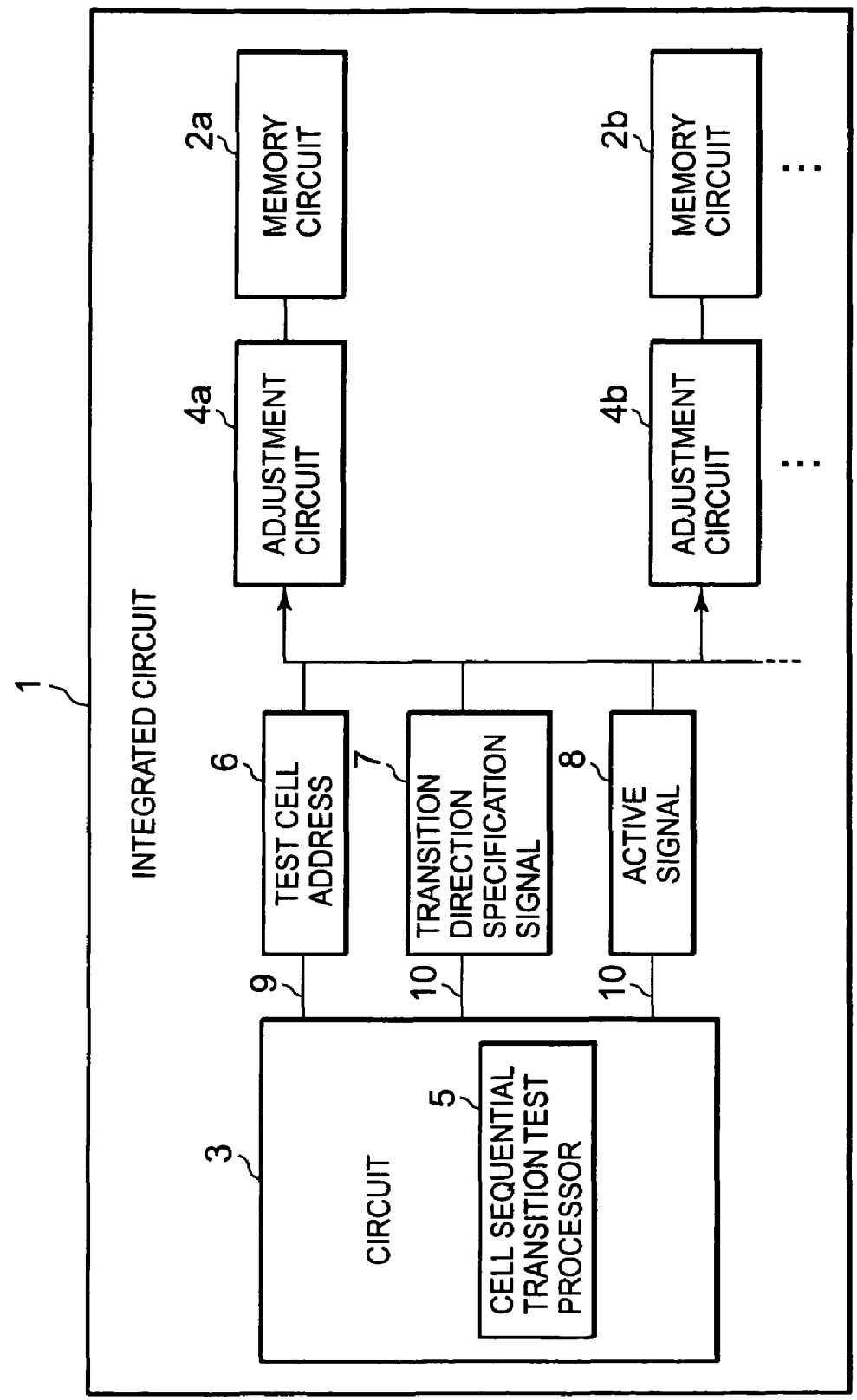
FIG. 1 is a block diagram showing a basic configuration of an integrated circuit according to the present invention.

FIG. 1 shows a basic configuration of an integrated circuit 1 according to the present invention. The integrated circuit 1 is an electronic device in which multiple semiconductor elements are integrated to achieve specific functions, and is configured by including multiple memory circuits 2a, 2b, ..., whose memory cell arrays are different in size, a BIST circuit 3 which outputs signals for testing each of the memory circuits 2a, 2b, ..., and adjustment circuits 4a; 4b, ..., which adjust the signals outputted from the BIST circuit 3 so that the signals fit to the structure of each of the memory circuits 2a, 2b, ....

The BIST circuit 3 includes a cell sequential transition test processor 5 executing a cell sequential transition test in which a test target memory cell sequentially transitions in a row or a column direction. The cell sequential transition test is executed as shown in FIG. 2, for example. A memory cell array 15 used in this example has a size in which a number of the total cells is 8×8=64, and addresses from 0 to 63 are assigned to memory cells, respectively. FIG. 2(a) shows an example in which a test target memory cell sequentially transitions in the row direction. At this point, the address of the test target memory cell is incremented as 0→1→2→ . . . →8→9→10→ . . . →62→63. FIG. 2(b) shows an example in which the test target memory cell sequentially transitions in the column direction. At this point, the address of the test target memory cell is incremented as 0→8→16→ . . . →1→9→17→ . . . →55→63.

As shown in FIG. 1, the BIST circuit 3 outputs a test cell address 6 specifying a location of a memory cell targeted for the cell sequential transition test, a transition direction specification signal 7 specifying the transition direction in the memory cells in the cell sequential transition test, and an active signal 8 determining whether or not the cell sequential transition test should be executed on each test cell address 6. The test cell address 6 is outputted through an internal address bus 9 to the adjustment circuits 4a, 4b, . . . , and the transition direction specification signal 7 and the active signal 8 are outputted through an internal control signal line group 10 to the adjustment circuits 4a, 4b, . . . .

The transition direction specification signal 7 is a control signal for specifying whether the test cell address 6 is incremented in the row direction or the column direction as shown in FIGS. 2A and 2B.

The active signal 8 is a control signal outputted while indicating a state that shows execution as "1", and a state that shows non-execution as "0", for example.

When the test cell address 6 corresponds to a cell in a virtual cell array being an area outside the memory cell array, the adjustment circuits 4a, 4b, . . . replace the test cell address 6 with a test cell address in a memory cell array area, or convert the active signal 8 outputted from the BIST circuit 3 as "1" showing execution into "0" indicating non-execution.

Descriptions will hereinafter be given of the specific structure and operations of the present invention.

First Exemplary Embodiment of the Invention

Figure 3:
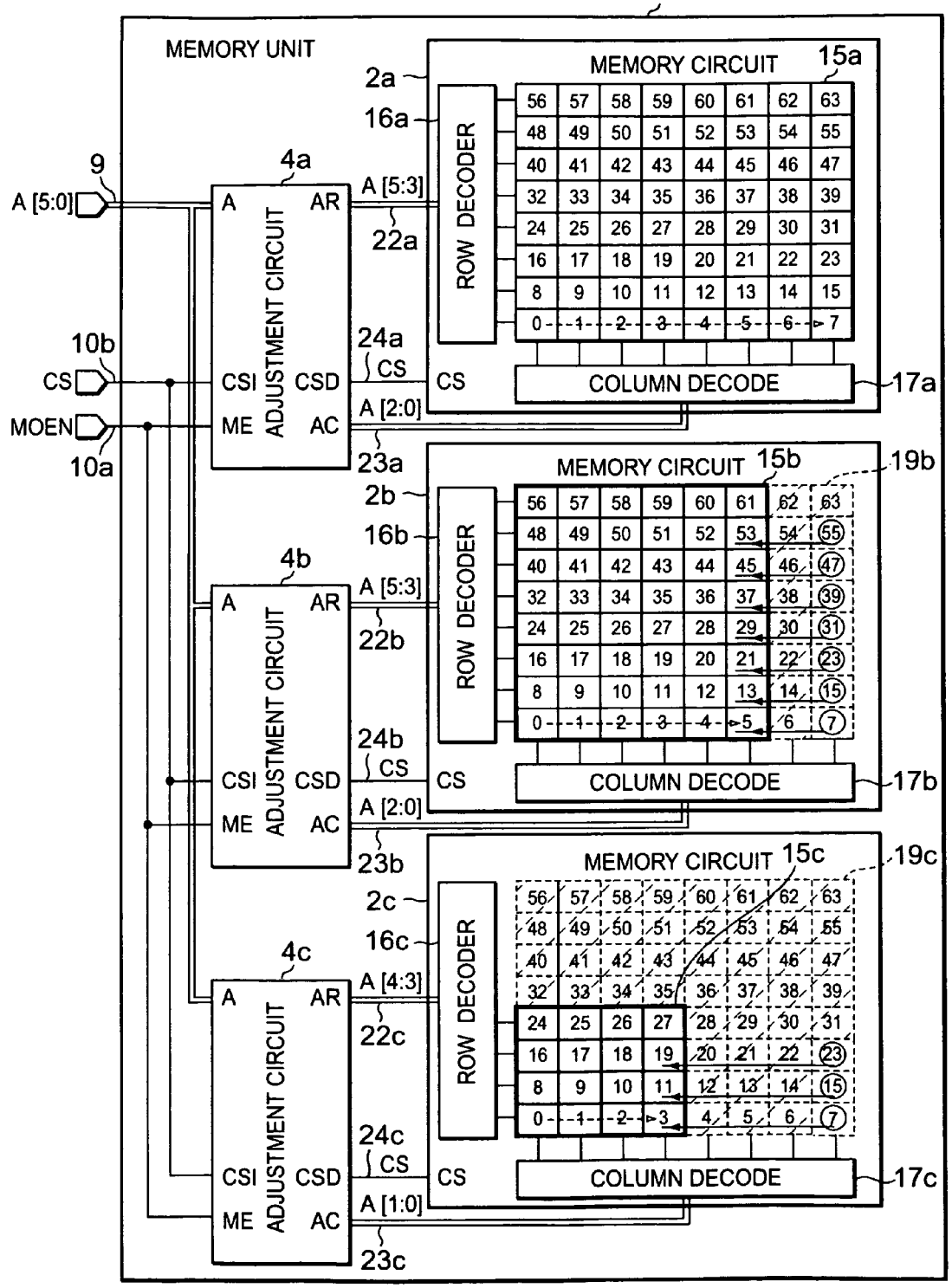
FIG. 3 is a view showing a configuration of a memory unit according to a first exemplary embodiment.

FIG. 3 shows the configuration of a memory unit 12 mounted on the integrated circuit 1. The memory unit 12 is configured by including three of the memory circuits 2a, 2b and 2c, and the adjustment circuits 4a, 4b and 4c respectively provided for the memory circuits 2a, 2b and 2c. In addition, shown in FIG. 3 is an example in which the address of a test target memory cell sequentially transitions in the row direction in the cell sequential transition test.

The memory circuits 2a, 2b and 2c are configured by including memory cell arrays 15a, 15b and 15c, row decoders 16a, 16b and 16c, and column decoders 17a, 17b and 17c, respectively. Here, as examples, a memory cell array with a structure of (row×column)=(8×8) having 64 cells in total is used as the memory cell array 15a of the first memory circuit 2a, a memory cell array with a structure of (row×column)=

(6×8) having 48 cells in total is used as the memory cell array 15b of the second memory circuit 2b and a memory cell array with a structure of (row×column)=(4×4) having 16 cells in total is used as the memory cell array 15c of the third memory circuit 2c.

Moreover, areas shown with broken lines in the second memory circuits 2b and the third memory circuit 2c indicate virtual cell arrays 19b and 19c respectively. The virtual cell arrays 19b and 19c are set based on one of the three memory cell arrays 15a, 15b and 15c which has the largest row address in size, and based on one of the three memory cell arrays 15a, 15b and 15c which has the largest column address in size. In the present exemplary embodiment, the virtual cell arrays 19b and 19c are set based on the first memory cell array 15a. The virtual cell array 19b of the second memory circuit 2b is an area outside the second memory cell array 15b and also inside the first memory cell array 15a. The virtual cell array 19c of the third memory 2c is an area outside the third memory cell array 15c and inside the first memory cell array 15a.

The row decoders 16a, 16b and 16c determine word lines to be connected thereto in the memory cell arrays 15a, 15b and 15c based on upper addresses of the test cell addresses 6 respectively outputted from the adjustment circuits 4a, 4b and 4c. The column decoder 17 determines bit lines to be connected thereto in the memory cell arrays 15a, 15b and 15c based on lower addresses of the test cell addresses 6 o respectively outputted from the adjustment circuits 4a, 4b and 4c.

Figure 4:
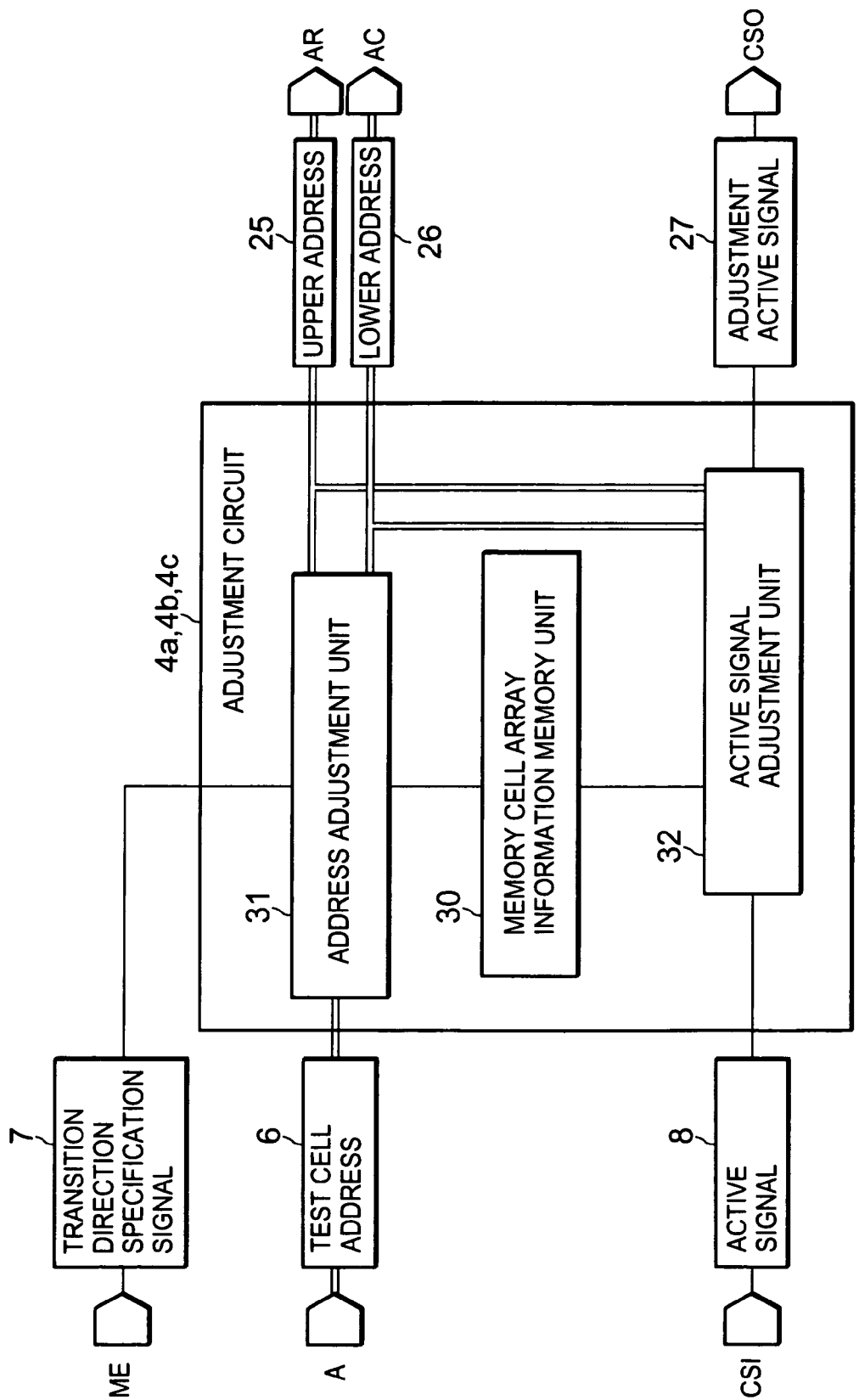
FIG. 4 is a block diagram showing an internal configuration of an adjustment circuit.

As shown in FIGS. 3 and 4, each of the adjustment circuits 4a, 4b and 4c have input terminals A, CSI, ME and output terminals AR, CSO and AC. The input terminals A are connected to an output terminal A [5:0] of the BIST circuit 3 (refer to FIG. 1) through the internal address bus 9, and respectively receive the test cell addresses 6 outputted from the BIST circuit 3. The input terminals ME are connected to an output terminal MOEN of the BIST circuit 3 through a part 10a of the internal control line group 10, and respectively receive the transition direction specification signals 7 outputted from the BIST circuit 3. The input terminals CSI are connected to an output terminal CS of the BIST circuit 3 through a part 10b of the internal control line group 10, and respectively receive the active signals 8 outputted from the BIST circuit 3. The output terminals AR are connected to the row decoders 16a, 16b and 16c through upper address buses 22a, 22b and 22c, and output upper addresses 25 generated by processing the test cell addresses 6 inputted from the input terminals A, respectively. The processing performed here will be described later. The upper addresses 25 indicate the row addresses of test target memory cells, respectively. The output terminals AC are respectively connected to the column decoder 17a, 17b and 17c through lower address buses 23a, 23b and 23d, and respectively output lower addresses 26 generated by processing the test cell addresses 6 inputted from the input terminals A, respectively. The processing performed here will be described later. The lower addresses 26 indicate the column addresses of test target memory cells, respectively. The output terminals CSO are connected to the memory circuits 2a, 2b and 2c through control signal lines 24a, 24b and 24c, and output adjusted active signals 27 generated by processing the active signals 8 inputted from the input terminals CSI, respectively. The processing performed here will be described later.

FIG. 4 shows an internal structure of each of the adjustment circuits 4a, 4b and 4c. The adjustment circuits 4a, 4b and 4c are each configured by including a memory cell array information memory unit 30, an address adjustment unit 31 and an active signal adjustment unit 32.

The memory cell array information memory unit 30 holds information on the memory cell arrays 15a, 15b and 15c of the memory circuits 2a, 2b and 2c respectively connected to the adjustment circuits 4a, 4b and 4c. The information includes the sizes and the like of the memory cell arrays 15a, 15b and 15c, and of the virtual cell arrays 19b and 19c.

The address adjustment units 31 generate the upper addresses 25 and the lower addresses 26 based on the test cell addresses 6 inputted from the BIST circuit 3 to the input terminals A, the transition direction specification signals 7 inputted from the BIST circuit 3 to the input terminals ME, and the information held by the memory cell array information memory units 30. The address adjustment units 31 then output the upper addresses 25 to the row decoders 16a, 16b and 16c through the output terminals AR, respectively, and output the lower addresses 26 to the column decoders 17a, 17b and 17c through the output terminals AC, respectively.

The active signal adjustment units 32 generate the adjusted active signals 27 based on the active signals 8 inputted from the BIST circuit 3 to the input terminals CSI, the upper addresses 25, the lower addresses 26, and the information held by the memory cell array information memory units 30. The active signal adjustment units 32 then output the generated signals to the memory circuits 2a, 2b and 2c through the output terminals CSO.

Figure 5:
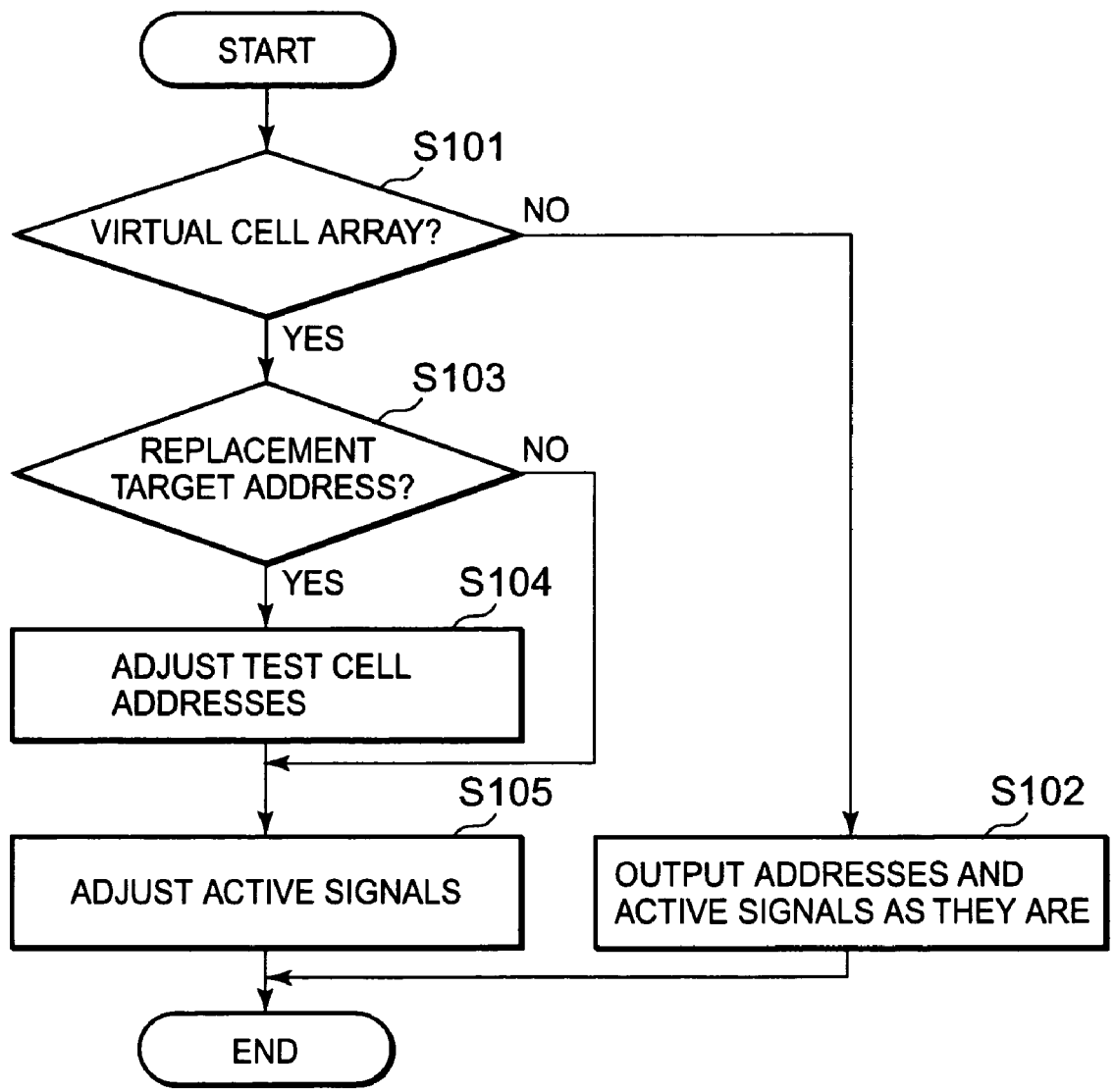
FIG. 5 is a flowchart showing a flow of processing by the adjustment circuit.

In FIG. 5, descriptions will be given of a processing flow performed by the adjustment circuits 4a, 4b and 4c. Firstly, the address adjustment units 31 determine whether or not the inputted test cell addresses 6 correspond to cells in the virtual cell arrays 19b and/or 19c (S101). When it is determined in S101 that the test cell addresses 6 do not correspond to the cells in the virtual cell arrays 19b and/or 19c (N), the address adjustment units 31 generate the upper addresses 25 and the lower addresses 26 without adding any adjustment on the inputted test cell addresses 6, and output the generated addresses from the output terminals AR and AC. Meanwhile, the active signal adjustment units 32 maintain the states of the inputted active signals 8 as they are, and output the maintained signals from the output terminals CSO as the adjusted active signals 27 (S102).

When it is determined in S101 that the test cell addresses 6 correspond to the cells in the virtual cell arrays 19b and 19c (Y), the determination is subsequently made as to whether or not the test cell addresses 6 are replacement target addresses (S103).

The replacement target addresses are selected from addresses positioned in the largest row part or the largest column part in the area of the virtual cell arrays 19b and 19c. The present exemplary embodiment causes the address of a test target memory cell to sequentially transition in the row direction and, therefore, the replacement target addresses are selected from addresses positioned in the largest row part. Specifically, as shown in FIG. 3, the replacement target addresses correspond to encircled addresses in the areas of the virtual cell arrays 19b and 19c. In other words, the replacement target addresses in the exemplary embodiment are 7, 15, 23, 31, 39, 47 and 55 in the second memory circuit 2b, and 7, 15 and 23 in the third memory circuit 2c.

When it is determined in S103 that the test cell addresses 6 correspond to the replacement target addresses (Y), the address adjustment units 31 (refer to FIG. 4) add an adjustment on the test cell addresses 6, generate the upper addresses 25 and the lower addresses 26 based on the adjusted test cell addresses 6, and output the generated addresses (S104). The active signal adjustment units 32 then add an adjustment on the active signals 8 inputted from the BIST circuit 3 through the input terminals CSI, and output the adjusted signals as the adjusted active signals 27 from the output terminals CSO (S105).

FIGS. 6 and 7 show specific processing results by S104 and S105. FIG. 6 shows adjustments on the test cell address 6 and the active signal 8 in the second memory circuit 2b (adjustment means 4b). In the drawing, provided are an input test cell address field 40, an input active signal field 41, an upper address field 42, a lower address field 43, and an adjusted active signal field 44. In addition, FIG. 7 shows adjustments on the test cell address 6 and the active signal 8 in the third memory circuit 2c (adjustment means 4c). In the drawing, provided are an input test cell address field 50, an input active signal field 51, an upper address field 52, a lower address field 53, and an adjusted active signal field 54.

The input test cell addresses 40 and 50 show the test cell addresses 6 inputted from the BIST circuit 3. In this manner, the input test cell addresses 6 are outputted in accordance with the size of the largest first memory cell array 15a regardless of the sizes of the second memory cell array 15b and the third memory cell array 15c. Furthermore, in present the exemplary embodiment, since a test target cell sequentially transitions in the row direction, the test cell addresses 6 are inputted from 0 to 63 in ascending order.

The input active signal fields 41 and 51 show the active signals 8 inputted from the BIST circuit 3 respectively for the test cell addresses 6. In the active signal 8, "1" shows execution, and "0" shows non-execution, and in this example, all the active signals 8 are in the state of "1" at the point when being outputted from the BIST circuit 3.

The upper address fields 42 and 52 are the upper addresses 25 (refer to FIG. 4) which are generated respectively for the test cell addresses 6, and show the row addresses of memory cells ultimately to be tested.

The lower address fields 43 and 53 are the lower addresses 26 (refer to FIG. 4) which are generated respectively for the test cell addresses 6, and show the column addresses of memory cells ultimately to be tested.

The adjusted active signal fields 44 and 54 show the adjusted active signals 27 (refer to FIG. 4) which are appropriately adjusted in accordance with the test cell addresses 6 respectively. The adjusted active signals 27 are given as "1" or "0" depending on whether the inputted test cell addresses 6 correspond to the cells in the virtual cell arrays 19b 19c, or to the replacement target addresses.

The replacement target addresses are selected from addresses corresponding to the cell in the largest column parts (in the far-right columns in the broken line areas in FIG. 3) of the virtual cell arrays 19b and 19c. Additionally, the replacement target addresses are moved in a direction opposite to the transition direction in the memory cells specified by the transition direction specification signal 7, and are replaced with first hit addresses in the areas of the memory cell arrays 15a and 15b as a result of the movement. The adjusted active signals 27 for the addresses replaced in this manner are set to "1", and the adjusted active signals 27 for the other addresses in the virtual cell arrays 19b and 19c are set to "0".

Specifically, as shown in FIGS. 3, 6 and 7, the replacement target addresses 7, 15, 23, 31, 39, 47 and 55 of the second memory circuit 2b are replaced with 5, 13, 21, 29, 37, 45 and 53 respectively. The replacement target addresses 7, 15 and 23 of the third memory circuit 2c are replaced with 3, 11 and 19 respectively. It should be noted that the address 63 of the second memory circuit 2b and the addresses 31, 39, 47, 55 and 63 of the third memory circuit 2c correspond to the cells in the largest column parts of the virtual cell arrays 19b and 19c similarly to the replacement target addresses. However, these addresses are not to be replaced since their transition orders are after the last addresses 61 and 27 of the memory cell arrays 15b and 15c (this is handled by setting the adjusted active signals 27 to "0").

According to the above configuration, the replacement of the addresses corresponding to the cells in the virtual cell arrays 19b and 19c with the addresses in the memory cell arrays 15b and 15c where test target memory cells really exist, or the conversion of the active signals 8 into ones indicating non-execution state are automatically performed for the addresses corresponding to the cells in the virtual cell arrays 19b and 19c. Therefore, the one BIST circuit 3 can simultaneously execute the cell sequential transition test on the memory circuits 2a, 2b and 2c which are different in size. Moreover, according to the above configuration, even if the memory circuit 2b having the memory cell number which is not the factorial of 2 is mixed, it is made possible to simultaneously execute the cell sequential transition test on all of the memory circuits 2a, 2b and 2c.

Second Exemplary Embodiment of the Invention

Figure 8:
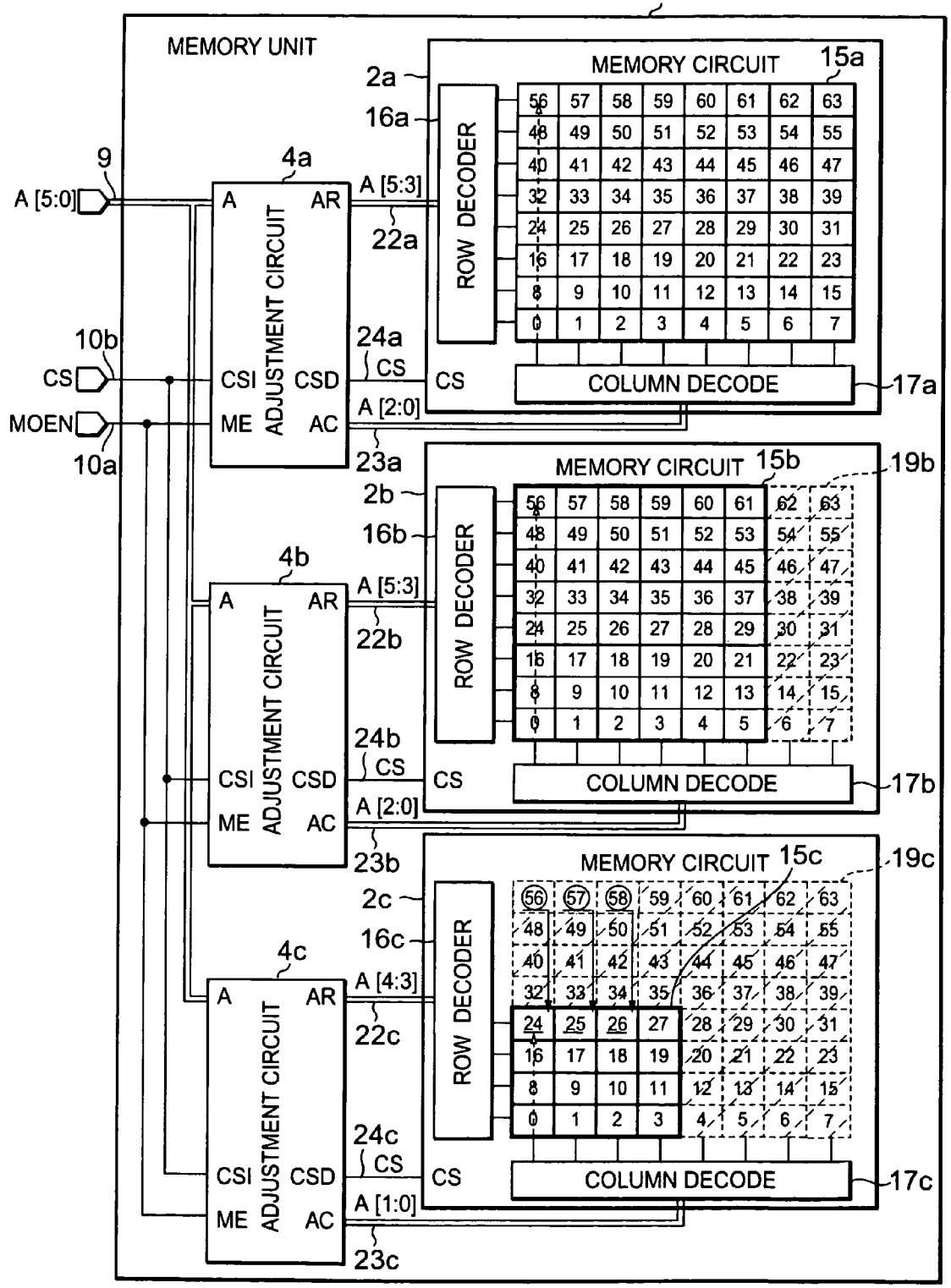
FIG. 8 is view showing a configuration of a memory unit according to a second exemplary embodiment.
Figure 9:
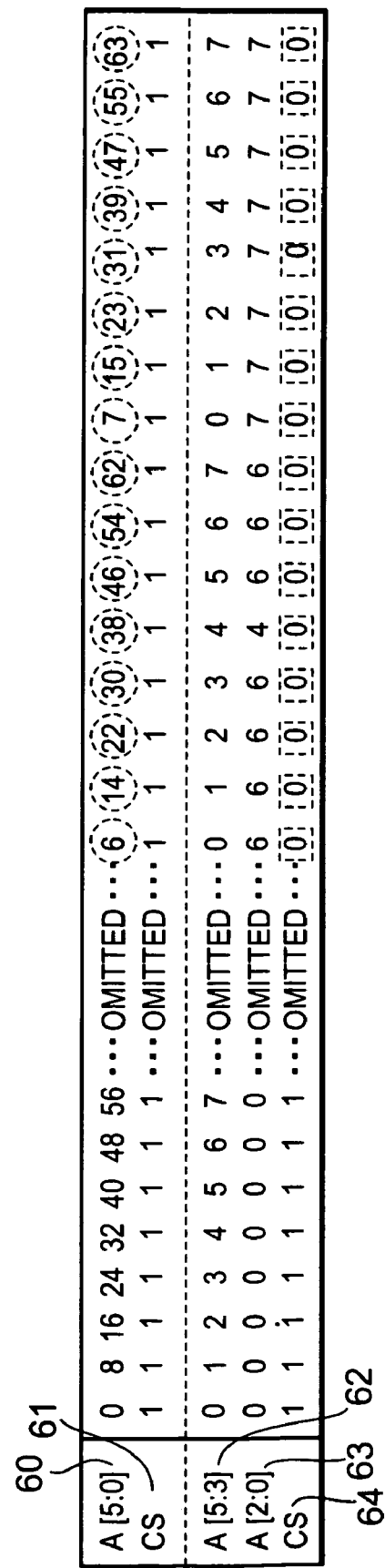
FIG. 9 is an example of the adjustment results of test cell addresses and active signals in a second memory circuit in the second exemplary embodiment.

In FIGS. 8, 9 and 10, an example of a case where a cell transition direction in the cell sequential transition test is set in the column direction. The configurations of the memory circuits 2a, 2b, 2c and the like are the same as in the above first exemplary embodiment.

In this case, the replacement target addresses do not exist in the second memory circuit 2b, so the replacement target addresses are 56, 57 and 58 encircled in the third memory circuit 3b in the drawing. These replacement target addresses 56, 57 and 58 are selected from addresses corresponding to the cells in the largest row part (the top row in the broken line areas in FIG. 8) of the virtual cell array 19c, are moved in a direction opposite to the transition direction in the memory cells specified by the transition direction specification signal 7, and are replaced with the first hit addresses 24, 25 and 26 in the memory cell array 15c as a result of the movement.

FIG. 9 shows specific adjustment results (the processing results by S104 (refer to FIG. 5) and S105) of the test cell addresses 6 and the active signals 8 in the second memory circuit 2b. In the drawing, the addresses encircled with broken lines correspond to the cells in the virtual cell array 19b, and all the adjusted active signals 27 for the addresses become "0" as shown with squares of broken lines.

FIG. 10 shows specific adjustment results (the processing results by S104 (refer to FIG. 5) and S105) of the test cell addresses 6 and the active signals 8 in the third memory circuit 2c. In the drawing, the addresses encircled with broken lines correspond to the cells in the virtual cell array 19c, and the addresses encircled with solid lines correspond to the replacement target addresses. All the adjusted active signals 27 for the addresses corresponding to the cells in the virtual cell array 19c become "0" as shown with squares of broken lines. The adjusted active signals 27 for the replacement target addresses become "1" as shown with squares of solid lines.

In this manner, even if the transition direction in memory cells is set to a column direction in the cell sequential transition test, the replacement of the addresses corresponding to the cells in the virtual cell arrays 19b and 19c with the addresses in the memory cell arrays 15b and 15c in which test target memory cells really exist or the conversion of the active signals 8 into ones indicating non-execution state is automatically performed for the addresses corresponding to the cells in the virtual cell arrays 19b and 19c similarly to the above first exemplary embodiment. Therefore, the one BIST circuit 3 allows the cell sequential transition test to be simultaneously executed on the memory circuits 2a, 2b and 2c which are different in size. Furthermore, even if the memory circuit 2b whose number of memory cell is not the factorial of 2 is mixed, the above configuration allows the cell sequential transition test to be simultaneously executed on all the memory circuits 2a, 2b and 2c.

Further, it is noted that Applicant's intent is to encompass equivalents of all claim elements, even if amended later during prosecution.

What is claimed is:

1. An integrated circuit, comprising:
    a plurality of memory circuits including memory cell arrays different in size;
    a BIST (built in self test) circuit which includes a cell sequential transition test processor executing a cell transition test in which a test target memory cell is caused to sequentially transition in a row or column direction, the BIST circuit outputting a test cell address specifying a location of the memory cell targeted for the cell sequential transition test, a transition direction specification signal specifying a transition direction in the memory cells in the cell sequential transition test, and an active signal determining an execution/non-execution of the cell sequential transition test for the test cell address; and
    a plurality of adjustment circuits provided for the respective memory circuits, each adjustment circuit performing either replacement of the test cell address outputted from the BIST circuit with an address in an area inside the corresponding memory cell array, or conversion of the active signal into a signal indicating non-execution, when the test cell address corresponds to a cell in a virtual cell array being in an area outside the memory cell array.

2. The integrated circuit according to claim 1,
    wherein the adjustment circuit moves the test cell address corresponding to a cell in a largest row part or a largest column part in the virtual cell array area in a direction opposite to the transition direction in the memory cells specified by the transition direction specification signal, and replaces the test cell address with a first address in the memory cell array area as a result of the movement.

3. The integrated circuit according to claim 1,
    wherein the virtual cell array is set based on the memory cell array whose row address size is largest and the memory cell array whose column address size is largest among the plurality of memory circuits.

4. The integrated circuit according to claim 1,
    wherein one or more of the memory circuits each has a memory cell array whose total number of memory cells is other than a factorial of 2.

5. The integrated circuit according to claim 1,
    wherein a memory unit and the BIST circuit are placed on a substrate, the memory unit being configured by including the plurality of memory circuits and the adjustment circuits provided respectively for the memory circuits.

6. A memory test method for an integrated circuit, including:
    a plurality of memory circuits including memory cell arrays different in size;
    a BIST circuit which outputs a signal for testing each of the plurality of memory circuits; and
    a plurality of adjustment circuits each of which adjusts the signal outputted from the BIST circuit so as to fit the signal to a structure of the corresponding memory circuit,
    the method comprising:
    causing the BIST circuit to output a test cell address that specifies a location of a test target memory cell in a cell sequential transition test in which the test target memory cell is caused to sequentially transition in a row or column direction;
    causing the BIST circuit to output a transition direction specification signal that specifies a transition direction in the memory cells in the cell sequential transition test;
    causing the BIST circuit to output an active signal that determines an execution/non-execution of the cell sequential transition test for the test cell address; and
    causing each of the adjustment circuits to perform either replacement of the test cell address with an address in an area inside the corresponding memory cell array or conversion of the active signal into a signal indicating non-execution, when the test cell address corresponds to a cell in a virtual cell array being in an area outside the memory cell array.

7. The memory test method according to claim 6,
    wherein the adjustment circuit moves the test cell address corresponding to a cell in a largest row part or a largest column part in the virtual cell array area in a direction opposite to the transition direction in the memory cells specified by the transition direction specification signal, and replaces the test cell address with an address with the first address in the memory cell array area as a result of the movement.

8. The memory test method according to claim 6,
    wherein the virtual cell array is set based on the memory cell array whose row address size is largest and the memory cell array whose column address size is largest among the plurality of memory circuits.

9. The memory test method according to claim 6,
    wherein one or more of the memory circuits each has a memory cell array whose total number of memory cells is other than a factorial of 2.

10. A method of testing a memory circuit including a plurality of memory cells by incrementing an address, comprising:
    accessing a first group of memory cells in the memory circuit by a first series of addresses obtained by incrementing the address;
    when, in the memory circuit, there is no memory cell indicated by a second series of addresses obtained by incrementing the addresses of the first series of the addresses, accessing a last memory cell of the first group by changing an address from a last address of the second series of the addresses to the last address of the first series of the addresses; and
    accessing a third group of memory cells in the memory circuit by a third series of addresses obtained by incrementing the address of the second series of the addresses.

* * * * *